US010551427B2

(12) United States Patent
Beck

(10) Patent No.: US 10,551,427 B2
(45) Date of Patent: Feb. 4, 2020

(54) METHOD FOR MULTICARRIER MOBILITY SPECTRUM ANALYSIS

(71) Applicant: U.S. Army Research Laboratory ATTN: RDRL-LOC-I, Adelphi, MD (US)

(72) Inventor: William A. Beck, Woodbine, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 228 days.

(21) Appl. No.: 15/431,941

(22) Filed: Feb. 14, 2017

(65) Prior Publication Data
US 2018/0231602 A1 Aug. 16, 2018

(51) Int. Cl.
*G01R 31/26* (2014.01)
*G01R 33/12* (2006.01)
*G01R 33/07* (2006.01)

(52) U.S. Cl.
CPC ......... *G01R 31/2648* (2013.01); *G01R 33/07* (2013.01); *G01R 33/1253* (2013.01)

(58) Field of Classification Search
CPC . G01R 33/07; G01R 33/1253; G01R 31/2648
See application file for complete search history.

(56) References Cited

U.S. PATENT DOCUMENTS 5,789,931 A 8/1998 Meyer et al.
6,100,704 A * 8/2000 Meyer ................ G01R 31/2648
324/251
6,791,339 B2 9/2004 Licini et al.
7,109,724 B2 9/2006 Eberhardt et al.
8,207,748 B2 6/2012 Blew et al.
(Continued)

FOREIGN PATENT DOCUMENTS

DE 4231392 * 3/1997

OTHER PUBLICATIONS

Beck et al., "Determination of electrical transport properties using a novel magnetic field-dependent Hall technique", J Appl Phys 62, 541 (1987).*

(Continued)

*Primary Examiner* — Mohamed Charioui
*Assistant Examiner* — Catherine T. Rastovski
(74) *Attorney, Agent, or Firm* — Eric Brett Compton

(57) ABSTRACT

A method for determining a two-dimensional spectrum of a specified carrier having a specified mobility and density in a material of an electronic device, the method including performing a magnetic field-dependent Hall measurement on the material of the electronic device; determining, using the magnetic field-dependent Hall measurement, a probability density function of a conductance of the material of the electronic device, wherein the probability density function describes a spectrum of a plurality of m-carriers, wherein the plurality of m-carriers includes the specified carrier having the specified mobility and density; and determining an electrical transport of a plurality of electrons and holes inside the material of the electronic device by observing a variation of the probability density function with any of the specified mobility and density of the specified carrier.

20 Claims, 6 Drawing Sheets

(56) References Cited

U.S. PATENT DOCUMENTS

2014/0343870 A1* 11/2014 Martel .................. G01N 27/72 702/23

OTHER PUBLICATIONS

Kiatagamolchai et al. "Mobility spectrum computational analysis using a maximum entropy approach", Phys Rev E 66, 036705 (2002).*

Vurgaftman et al., "improved quantitative mobility spectrum analysis for Hall characterization", J Applied Phys 84, 4966 (1998).*

Dziuba et al., "analysis of the electrical conduction using an iterative method", J. Phys. III France 2 (1992).*

Du et al, "Characterizing Multi-Carrier Devices with Quantitative Mobility Spectrum Analysis and Variable Field Hall Measurements", Jpn J Appl Phys 41 (2002).*

Ashcroft and Mermin, Solid State Physics. Fort Worth, Harcourt College Publishers, 1976, p. 12.*

Kiatgamolchai et al., "Mobility spectrum computational analysis using a maximum entropy approach", Phys Rev E 66, 036705 (2002).*

Beck WA, Anderson Jr., "Determination of electrical transport properties using a novel magnetic field-dependent Hall technique," J Appl Phys. 1987; 62:541.

Dziuba Z., Gorska M., "Analysis of the electrical conduction using an iterative method" J Phys III 1992;2(1):99-110.

J. Antoszewski et al., "Magneto-transport characterization using quantitative mobility-spectrum analysis" J Electronic Materials. 1995;24(9):1255-62.

J. Meyer et al., "Quantitative mobility spectrum analysis of multicarrier conduction in semiconductors." J Appl Phys. 1997;81(2):709-13.

I. Vurgaftman et al., "Improved quantitative mobility spectrum analysis for Hall characterization." J Appl Phys. 1998;84(9):4966-73.

I. Vurgaftman et al., "Quantitative mobility spectrum analysis (QMSA) for Hall characterization of electrons and holes in anisotropic bands." J. Electronic Materials. 1999;28(5):548-52.

S. Kiatgamolchai et al. "Mobility spectrum computational analysis using a maximum entropy approach." Physical Review E 2002;66(3):036705.

D. Chrastina et al, "Application of Bryan's algorithm to the mobility spectrum analysis of semiconductor devices." J Appl Phys. 2003;94(10):6583-90.

J. Antoszewski, L. Faraone, "Quantitative mobility spectrum analysis (QMSA) in multi-layer semiconductor structures." Optoeleectronics Review. 2004:12(4):347.

J. Antoszewski et al., "Application of quantitative mobility-spectrum analysis to multilayer HgCdTe structures," J Electronic Materials 2004;33(6):673-83.

J. Rothman et al., "Maximum entropy mobility spectrum analysis of HgCdTe heterostructures." J Electronics Materials. 2006;35(6):1174-84.

J. Antoszewski et al., "High-resolution spectrum analysis of multicarrier transport in advance infrared materials." Electronic Materials. 2012;41(10):2816-23.

* cited by examiner

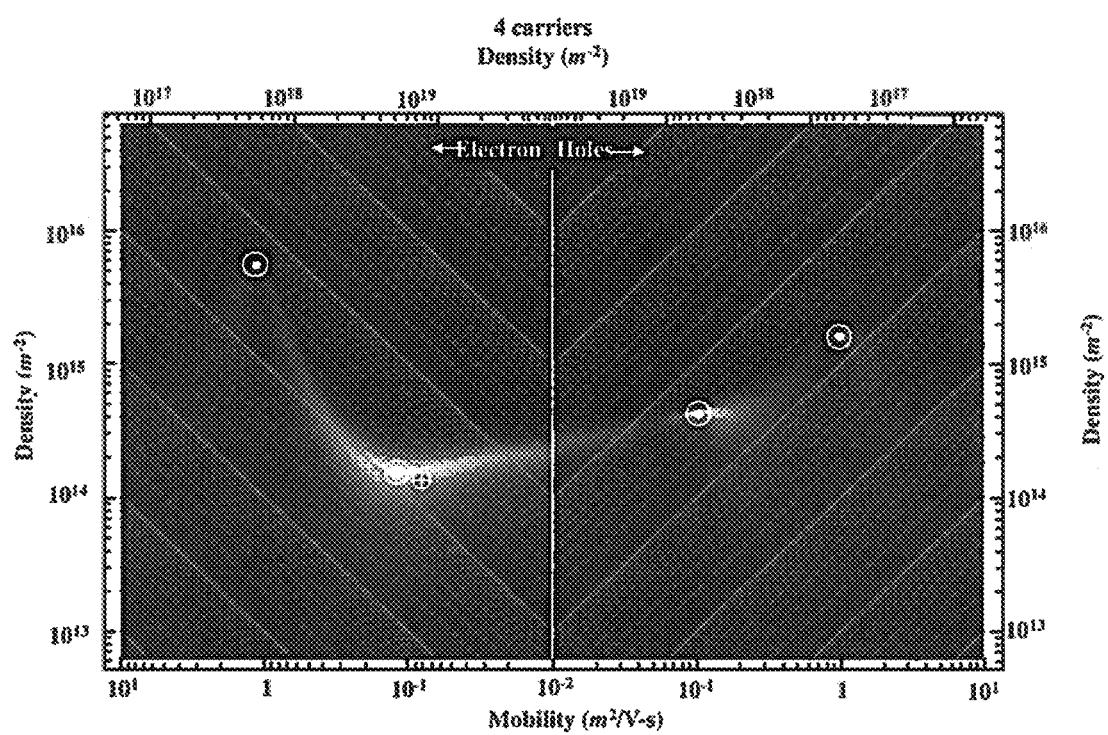

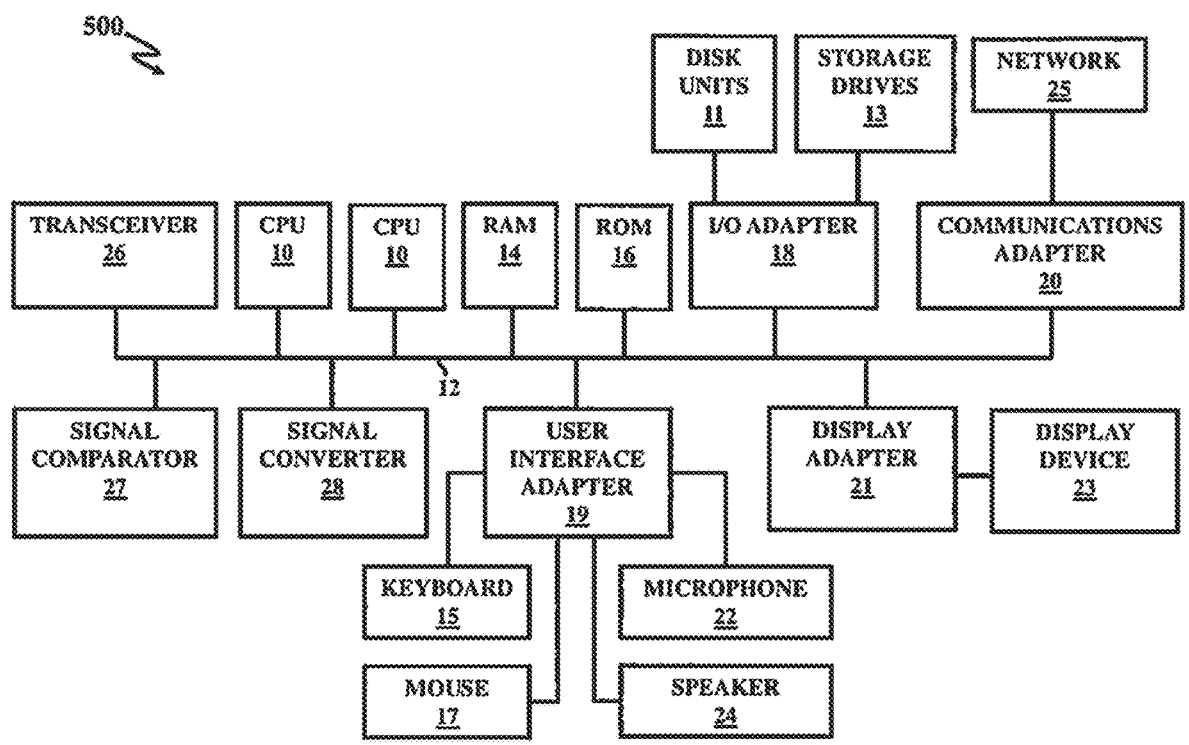

METHOD FOR MULTICARRIER MOBILITY SPECTRUM ANALYSIS

GOVERNMENT INTEREST

The embodiments herein may be manufactured, used, and/or licensed by or for the United States Government without the payment of royalties thereon.

BACKGROUND

Technical Field

The embodiments herein generally relate to analyzing electronic devices, and more particularly to determining a two-dimensional spectrum of carrier mobility and density in the material in the electronic devices.

Description of the Related Art

Modern electronic devices use semiconductor structures designed using multiple layers with different electronic and optical properties. Therefore, it may be necessary to combine dissimilar layers in manufacturing electronic devices. However, combining dissimilar layers sometimes leads to creation of new charge ensembles, which may be to the benefit or harm of the functionality of the structure in device applications. It is therefore desirable to be able to distinguish and characterize the properties of each such layer.

One method that may be used in the characterization of semiconductor materials is a Hall effect measurement. The Hall effect measurement measures the transverse and longitudinal voltages created when a magnetic field is applied perpendicular to a current through the material under study. The Hall effect measurement may be used to determine parameters such as carrier mobility and carrier density and thereby characterize the semiconductor material.

Some conventional methods for evaluating properties of the material of an electronic device by analyzing the data from a magnetic field-dependent Hall effect measurement may favor narrow mobility peaks in the results, but such methods often exclude other valid solutions, thereby giving a misleading result to the user. Furthermore, some conventional methods do not consider noise uncertainties in the measurement so that the user has no idea of the uncertainty in the derived carrier properties.

SUMMARY

In view of the foregoing, an embodiment herein provides a method for determining a two-dimensional spectrum of the probability of a specified carrier having a specified mobility and density in a material of an electronic device, the method comprising performing a magnetic field-dependent Hall measurement on the material of the electronic device; determining, using the magnetic field-dependent Hall measurement, a probability density function of a conductance of the material of the electronic device, wherein the probability density function describes a spectrum of a plurality of m-carriers, wherein the plurality of m-carriers comprises the specified carrier having the specified mobility and density, and wherein m comprises an integer; and determining an electrical transport of a plurality of electrons and holes inside the material of the electronic device by observing a variation of the probability density function with any of the specified mobility and density of the specified carrier.

The method may further comprise determining a first a-vector, wherein the first a-vector is a representation of the magnetic field-dependent Hall measurement; determining a covariance matrix of the first a-vector using any of known and assumed measurement uncertainties in the magnetic field-dependent Hall measurement; determining, using the covariance matrix, a statistical chi-squared measure and a probability of a difference between the first a-vector and a second a-vector being equivalent to any of the known and the assumed measurement uncertainties; and determining, using any of the statistical chi-squared measure and the probability of the difference between the first and second a-vectors, a closeness of the first and second a-vectors corresponding to any of a smallness of an amount of the statistical chi-squared measure and largeness of an amount of the probability of the difference between the first and second a-vectors.

The method may further comprise calculating a first a-matrix using the first a-vector, the first a-matrix having a Hankel symmetry; calculating a plurality of eigenvalues of the first a-matrix and classify the first a-matrix, corresponding to the magnetic field-dependent Hall measurement physical or unphysical, wherein the first a-matrix is classified as physical when all of the plurality of eigenvalues are non-negative, and is described by at least one spectrum of the plurality of m-carriers with a plurality of all non-negative conductivities, and wherein the first a-matrix is classified as unphysical when any of the plurality of eigenvalues is negative; and determining, using the first a-matrix, an envelope of a plurality of all possible spectra that yield the magnetic field-dependent Hall measurement, wherein the envelope further describes a maximum conductivity of the plurality of m-carriers as a function of the mobility.

The method may further comprise determining a closest physical a-matrix to the unphysical a-matrix, by iteratively determining a new closest a-matrix with non-negative eigenvalues, and determining a closest Hankel matrix to the a-matrix with non-negative eigenvalues, until the new closest a-matrix converges to the closest physical Hankel matrix; terminating the iteration upon a chi-squared difference between the closest a-matrix and the new closest a-matrix changes by less than approximately 0.001; and determining a set of m-physical carriers corresponding to the closest Hankel matrix.

The method may further comprise determining a reduced a-matrix using the magnetic field-dependent Hall measurement, minus a specified a-matrix corresponding to the specified carrier having the specified mobility and density; and determining a closest physical a-matrix to the reduced a-matrix. Determining the closest physical a-matrix may use a symmetric whitening matrix that depends on noise in the magnetic field-dependent Hall measurement. The method may further comprise multiplying the first a-matrix by the symmetric whitening matrix to determine a whitened a-matrix. The closest Hankel matrix is determined by calculating a special rectangular-matrix form of the symmetric whitening matrix; computing a generalized inverse matrix of said rectangular-matrix form of the symmetric whitening matrix; and multiplying the generalized inverse matrix with a rectangular-matrix form of a whitened version of the first a-matrix.

The symmetric whitening matrix may be determined by (a) computing a set of Monte Carlo noise matrices for the magnetic field-dependent Hall measurement; (b) computing a plurality of noise-squared matrices corresponding to each of the Monte Carlo variations; (c) computing an average of the noise-squared matrices; (d) computing a fourth root matrix of the average of the noise-squared matrices, and multiplying each of the Monte Carlo noise matrices both on a left and a right side with the fourth root matrix to obtain a set of approximately whitened symmetric matrices; (e) repeating the steps (b) through (d), using the approximately whitened noise matrices from the step (d) instead of the Monte Carlo noise matrices; (f) repeating the steps (b)-(d) for a pre-determined number of times, saving a plurality of unique versions of the fourth root matrix computed in each pass through the step (d); and (g) determining the symmetric whitening matrix by multiplying the plurality of unique versions of the fourth root matrix saved in step (f).

The method may further comprise plotting a probability associated with the closest physical a-matrix versus the specified carrier having the specified mobility and density, wherein a maxima in the plot indicates the specified carrier densities and mobility, and a width of the maxima indicate uncertainties in the specified density and mobility.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3B is a graph illustrates a 4-carrier MMSA according to an exemplary embodiment herein;

FIG. 5 is a schematic diagram illustrating an exemplary computer architecture according to an embodiment herein.

DETAILED DESCRIPTION

Figure 1:
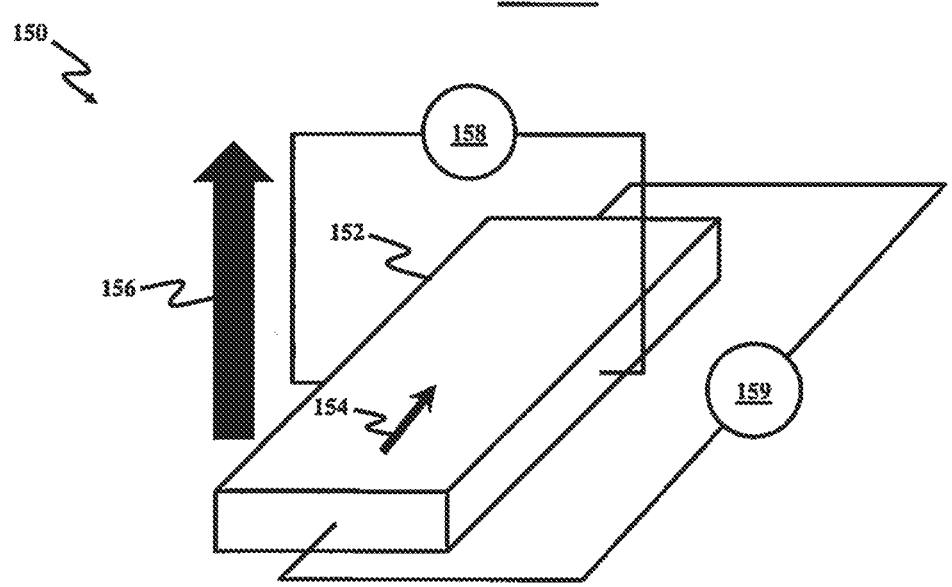
FIG. 1 is a schematic diagram illustrating a circuit for performing Hall effect measurement on a semiconductor device and which may be used in accordance with the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

An embodiment herein provides a method for calculating and presenting the spectrum of carrier densities and mobilities in the material of an electronic device from a magnetic field-dependent Hall measurement. Classical Hall effect measurements performed at a single magnetic field may only produce an average of all layer properties, which is not very useful. Instead, an embodiment herein provides a robust method that allows extraction of the properties of individual layers, or properties of multiple carrier types within an individual layer, which is of fundamental value to the semiconductor industry.

As mentioned, some conventional methods for evaluating properties of the material of an electronic device may favor narrow measurement peaks in analysis, but such methods often exclude other valid solutions, thereby giving a misleading result to the user. Furthermore, some conventional methods do not consider noise uncertainties in the measurement so that the user has no idea of the uncertainty in the derived carrier properties.

An embodiment herein includes measurement uncertainties as an integral part of the analysis. The embodiments herein derive two-dimensional spectra that show the likelihood of carriers versus both mobility and carrier density so that users can see the properties of the carriers as well as the uncertainties in those properties of the material of an electronic device. An embodiment herein derives peaks that yield as precise carrier properties as are consistent with the measurement uncertainties and with the maximum number of carriers allowed in the solutions, but do not exclude valid carrier descriptions.

An embodiment herein provides a method to (1) calculate the two-dimensional spectrum of carriers versus both mobility and density, (2) calculate the spectrum without assumptions about the spectrum other than the number of carriers that are present, and (3) include data uncertainties as an integral part of the calculation so that the spectrum shows the uncertainties of the derived carrier properties.

Referring now to the drawings, and more particularly to FIGS. 1 through 5, where similar reference characters denote corresponding features consistently throughout the figures, there are shown preferred embodiments.

FIG. 1 is a schematic diagram illustrating a circuit 150 for Hall measurement as used in accordance with an embodiment herein. As illustrated in FIG. 1, an electric current 154 may be applied to a semiconductor material 152. A magnetic field 156 may also be applied to the semiconductor material 152 in a direction perpendicular to the semiconductor material 152. The Hall effect generated by the interaction of the current 154 and the magnetic field 156 may be measured by measurement devices 158, 159, which may be configured as voltmeters. In one embodiment, a single voltmeter may be used for both of the measurement devices 158 and 159 by sequentially connecting to the semiconductor material 152 in the locations the measurement devices 158 and 159 are connected. In an embodiment herein, the Hall measurement involves measuring the voltage transverse to the current using device 158 and along the current using device 159 as the magnetic field 156 is adjusted to a set of values. Variations of this geometry including the van der Pauw and Hall bar geometries can also be used to obtain equivalent information.

In an original mobility spectrum analysis (MSA), as described in Beck W A, et al. *Determination of electrical transport properties using a novel magnetic field-dependent*

*Hall technique*, J Appl. Phys. 1987; 62:541, the contents of which in its entirety is incorporated herein by reference, for a broad range of sample types, the conductivity in a material can be described in terms of a continuous mobility spectrum, $s(\mu)$, by the integral transform:

$$\sigma_{xx}(H) = \int_{-\infty}^{\infty} \frac{s(\mu)d\mu}{1+(\mu H)^2} \quad (1)$$

$$\sigma_{xy}(H) = \int_{-\infty}^{\infty} \frac{\mu H s(\mu)d\mu}{1+(\mu H)^2} \quad (2)$$

where $\mu$ is mobility, H is magnetic field, $\sigma_{xx}$ and $\sigma_{xy}$ are the elements of the conductivity tensor, and where negative mobilities correspond to electrons and positive mobilities correspond to holes. Here, $s(\mu)$ must be $\geq 0$ at all $\mu$ for a physical spectrum. Moreover, for a set of Hall data specified as $\sigma_{xx}$ (H) and $\sigma_{xy}$ (H) at a discrete set of N magnetic fields $\{H_i\}$ with $H_1=0$, there is at least one physical mobility spectrum $s(\mu) > 0$ if, and only if, the N×N A-matrix defined by:

$$A_{ij} = \begin{cases} \sum_{k=1}^{N} (\sigma_{xx})_k (C_R^{-1})_{k,(i+j)/2}, & (i+j) \text{even} \\ \sum_{k=2}^{N} (\sigma_{xy})_k (C_I^{-1})_{k-1,(i+j-1)/2}, & (i+j) \text{odd} \end{cases} \quad (3)$$

has no negative eigenvalues. $C_R^{-1}$ and $C_I^{-1}$ are N×N and (N−1)×(N−1) matrices, respectively, that are determined from the set of $\{H_i\}$. (The sum over $\sigma_{xy}$ ($H_i$) skips the first element, $H_1=0$, since $\sigma_{xy}(0)=0$.) Therefore, evaluation of the eigenvalues of A yields a test for physical data: If the eigenvalues are all non-negative, then the Hall data corresponds to at least one physical $s(\mu)>0$. If any eigenvalues are negative, then there are no physical solutions.

Here, A is a Hankel matrix in which the value of each element is dependent only on the sum of the indices (i+j). Therefore, one can write A more compactly in terms of a (2N−1)-long a-vector with $a_{i+j-1}=A_{ij}$. Then, if one joins the N measured $\sigma_{xx}$ (H) and (N−1) measured $\sigma_{xy}$ (H) (skipping the first element, $\sigma_{xy}$ ($H_1=0$)) into a single vector $\sigma$, and use Eq. (3), a can be written as:

$$a = S \cdot \sigma \quad (4)$$

where S is a matrix whose elements depend only on the set of magnetic fields $\{H_i\}$. As long as the fields in $\{H_i\}$ are all distinct, S is non-singular, and Eq. (4) represents a reversible linear relationship between a and the measured $\sigma$, so that one can use the a-vector as an equivalent representation of the Hall data. Furthermore, the error covariance matrix $X_a$ for the elements of the derived a-vector is directly related to the covariance matrix $X_\sigma$ for the elements of the measured $\sigma$ through $X_\sigma = S^T X_a S$. Then, the $\chi^2$ computed from either $\delta\sigma$ or $\delta a = S \cdot \delta \sigma$ is the same:

$$\chi^2 = (\delta a) X_a (\delta a) = ((\delta \sigma) S^T) X_a (S(\delta \sigma)) = (\delta \sigma)(S^T X_a S)(\delta \sigma) = (\delta \sigma) X_\sigma (\delta \sigma). \quad (5)$$

The envelope of all possible physical $s(\mu)$ that are consistent with the data is determined by:

$$s = \frac{|v_\mu|^2}{\alpha_\mu} \left[ \sum_{i=1}^{N} \frac{\left(\sum_{j=1}^{N} Q_{ij}(v_\mu)_j\right)^2}{\lambda_i} \right]^{-1} \quad (6)$$

where $\{\lambda_i\}$ are the eigenvalues of A, Q is an orthogonal matrix whose columns are the eigenvectors of A, $$\alpha_\mu = \frac{\sigma_0}{\prod_{p=1}^{N}(1+H_p^2 \mu^2)} \sum_{j=0}^{N-'} \mu^{2j} \text{ and} \quad (7)$$

$$v_\mu = (1, -\mu, \mu^2, -\mu^3, \ldots, (-\mu)^{N-1}) \quad (8)$$

In the original mobility spectrum analysis (MSA), the test for physical solutions and the envelope of physical spectra given by Eq. (6) are absolute. That is, the test for physical data yields a yes or no answer. There are either physical solutions corresponding to the Hall data or there are not. In the case of the envelope function, there are physical solutions that contain carriers corresponding to points below the envelope function but no solutions contain carriers corresponding to points above the envelope function. The original MSA does not explicitly consider the effect of errors and uncertainties in the Hall data that blur the criteria for physical solutions into a probabilistic rather than an absolute answer. Furthermore, measured Hall data obtained at five or more magnetic fields is almost always unphysical due to small errors in the measurement. The original MSA essentially ignored small negative eigenvalues in the measured A by taking the absolute value of the eigenvalues, but a more mathematically sound way of handling unphysical starting data in the context of the noise characteristics of the measurement is better.

In contrast to the original MSA and all other known mobility spectrum techniques, data uncertainties in the Hall data are considered as an integral part of the new multicarrier mobility spectrum analysis (MMSA) presented by the embodiments herein, so that the results are always expressed in terms of probabilities. For example, the technique defines the probability that a set of Hall data corresponds to some physical $s(\mu)$, and the multicarrier mobility spectra define the probability that the physical solutions contain the carrier mobility and conductivity indicated on the spectrum.

As provided by the embodiments herein, the MMSA method also permits the user to restrict the number of carriers in the solutions included in the spectra, which has the effect of dramatically localizing the carriers into sharp peaks which indicate both the value and uncertainty of the carrier mobilities and conductivities (or densities). Examination of the variation of the probability of physical solutions versus the number of carriers allowed in the solutions permits the user to determine the likely number of carrier types in the sample. Finally, the assumption leading to narrow peaks in the MMSA; i.e., restriction of the number of carriers in the solutions, is explicit and easily understood by the user, whereas the assumptions leading to narrow peaks in other mobility spectral techniques are implicitly embedded in their algorithms and not generally understood by users.

The closest physical $A_p$ to an unphysical, measured $A_d$ is always an A-matrix that corresponds to a set of m discrete carriers. This is because unphysical A-matrices have one or more negative eigenvalues while physical A-matrices have eigenvalues that are either positive or zero. The boundary between physical and unphysical A-matrices comprises A-matrices with at least one zero eigenvalue and the rest of the eigenvalues positive. Since the closest $A_p$ must lie on the boundary, the closest $A_p$ has z≥1 zero eigenvalues, which corresponds to m=N−z discrete carriers. Although a general, physical A-matrix corresponds to a continuous spectrum of carrier mobilities, the closest physical spectrum to an unphysical measurement always includes a finite set of discrete carrier mobilities.

Figure 2:
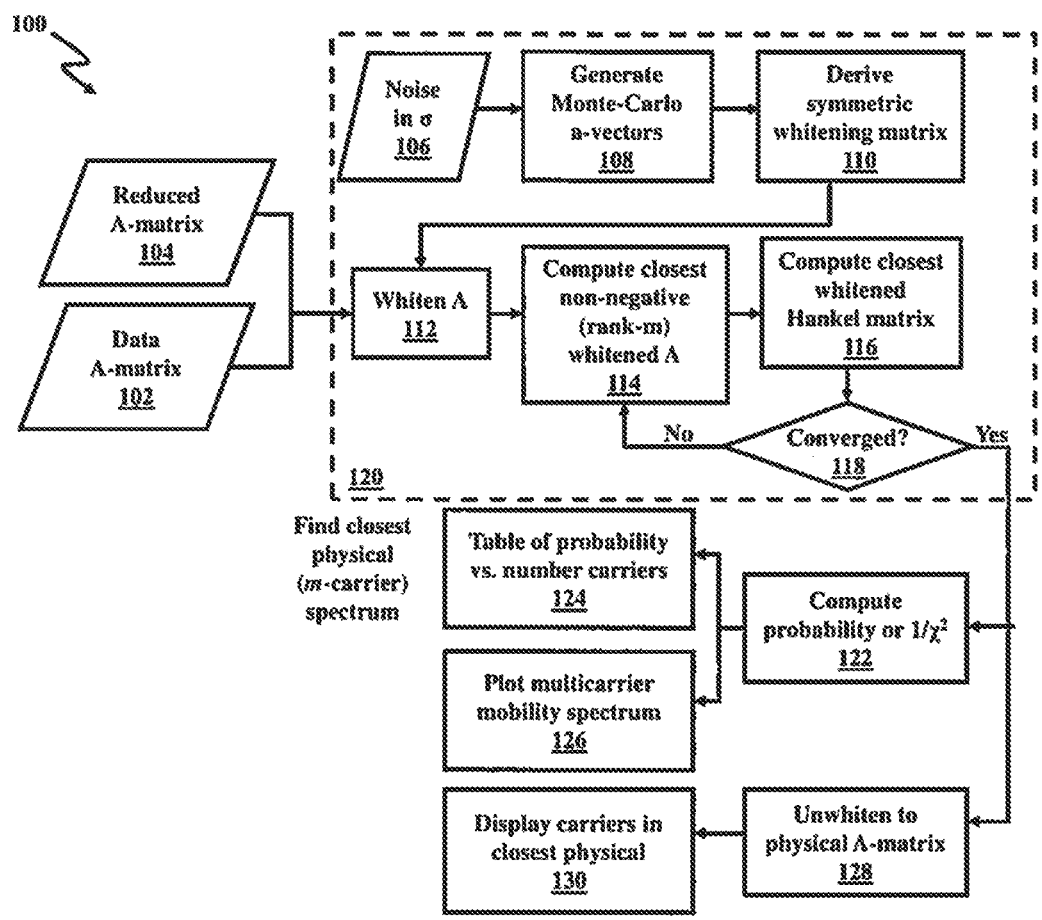
FIG. 2 is a flow diagram illustrating a method for multi-carrier mobility spectrum analysis (MMSA) according to an embodiment herein.

FIG. 2, with reference to FIG. 1, is a flow diagram illustrating method 100, according to an embodiment herein. Step 120 shows a fast and robust procedure to find the physical $A_p$ matrix that is statistically closest to unphysical Hall data represented by $A_d$, and a similar procedure to find the closest physical $A_m$-matrix that contains m or fewer discrete carriers. This procedure is used to compute the multicarrier mobility spectra, and is a fast and robust technique for computing multicarrier fits, especially with large numbers of carriers.

In an embodiment herein, the method 100 receives the noise in conductivity σ at step 106, and generates Monte-Carlo a-vectors at step 108. The method 100 determines a matrix W at step 110 for symmetrically whitening the A-matrices at step 112, receiving either a full data A-matrix 102 as input, or a reduced A-matrix 104 as input. As used in the embodiments herein, whitening a matrix refers to a linear transformation of the matrix that transforms it to a set of new variables whose covariance matrix is the identity matrix. In other words, the symmetric, whitened matrix $A_W = W^T A W$ has noise statistics such that the expectation of the square of the noise is $$\langle (\delta A_W^T)(\delta A_W) \rangle = I_N, \quad (9)$$

where $\delta A_W$ is the noise variation in $A_W$, $\delta A_W^T$ is the transpose of $\delta A_W$, and $I_N$ is the N×N identity matrix. The whitened $A_W$ has the same matrix inertia as A; i.e., the same number of positive, zero, and negative eigenvalues, so that $A_W$ is physical (non-negative definite) if, and only if, A is physical. The whitening matrix depends only on the uncertainty (noise) in the Hall data at the set of $\{H_i\}$ used for the measurement, and so it need only be computed once at the beginning stages of the method 100.

In an embodiment herein, the method 100, at step 114, uses the whitening matrix from the step 112 to whiten the unphysical input A-matrix. The method 100 may then, at step 116, use an iterative, alternating projection process to find the closest whitened A-matrix to the input matrix. This alternating projection process can also be used to find the closest, whitened, rank-m A-matrix, which corresponds to the closest physical spectrum consisting of m discrete carriers. If the input A-matrix to the step 112 is the full A-matrix 102 from the measurement, then the output is the closest physical spectrum corresponding to the measured data (or, optionally, the closest physical m-carrier description of the data, where "m" is an integer specifying the total number of carriers as defined by the user). On the other hand, if the input matrix is a reduced A-matrix 104, given by:

$$A_{reduced} = A - A_S(\mu, \sigma) \quad (10)$$

where $A_S (\mu, \sigma)$ is the A-matrix corresponding to a set of carriers with mobility μ and conductivity σ, then the output is the closest physical spectrum corresponding to the measured data that contains the carrier (μ, σ) (or, optionally, the closest physical m-carrier description of the data in which one of the m-carriers is (μ, σ)).

In an embodiment herein, once a closest whitened physical (or closest physical m-carrier) solution is found, by determining at step 118 that the process is converged, the method 100 proceeds to steps 122 and 128. At step 122, the method 100 computes the probability for the input data having occurred randomly as a noise perturbation of the solution. At step 128, the method 100 unwhitens the result to determine the mobility spectrum; i.e., physical carriers, corresponding to the solution.

Following step 128, at step 130, the method 100 computes the probability that the measured data corresponds to any physical solution, and display the carriers in that solution. Following step 122, the method 100 at step 124 computes a table of the probabilities versus the number of carriers in the solutions and, at step 126, displays the carriers in each of the m-carrier solutions. At step 126, method 100 may also compute and display multicarrier mobility spectra, which are plots of the probability of a physical, m-carrier solution existing that includes carriers with the mobility and conductivity indicated by the coordinates of the plot. These plots provide a description of the properties of the carriers present in the sample.

Figure 3A:
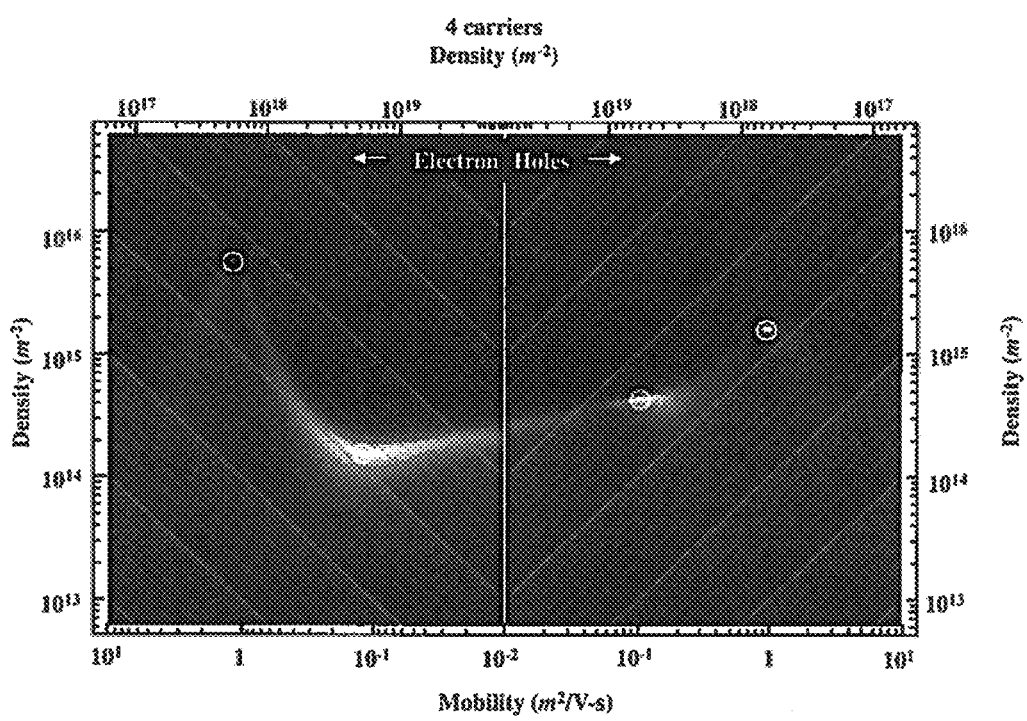
FIG. 3A is a graph illustrating 4-carrier mobility spectrum showing two-sided logarithmic plot of $1/\chi^2$ versus mobility and conductivity according to an exemplary embodiment herein.

FIG. 3A, with reference to FIG. 1, is a graph illustrating a 4-carrier mobility spectrum from a measured superlattice sample. FIG. 3A shows a two-sided logarithmic plot of $1/\chi^2$ versus mobility and carrier density. Circles on FIG. 3A indicate the most likely carrier properties. The "hotter" bright regions on FIG. 3A show the likely carrier mobilities and densities of the four carriers while the lateral spreading of the hot (brighter) regions indicates the uncertainty in those values.

An embodiment herein provides a Monte Carlo method for symmetric whitening. The procedure to find the closest physical, or closest physical rank-m, matrix further described below, requires a whitened, symmetric matrix. Therefore, the raw A-matrix calculated from Eq. (3) must be converted to a matrix with the same inertia, but with whitened noise as defined by Eq. (9). In an embodiment herein, this is accomplished by the following iterative process:

1. Compute a set of $N_{MC}$ Monte Carlo noise variations $\{\delta A_0\}$ using the known (or assumed) characteristics of the noise in the measured $\sigma_{xx}$ (H) and $\sigma_{xy}$ (H).
2. Compute the average $\Omega_0 = \langle (\delta A_0^T)(\delta A_0) \rangle$ for the set of Monte Carlo variations.
3. Whiten each of the Monte Carlo variations by $\delta A_{w0} = \Omega_0^{1/4} (\delta A_0) \Omega_0^{1/4}$, where $\Omega_0^{1/4}$ indicates the matrix fourth root of $\Omega_0$. (Since $\Omega_0^{1/4}$ has all positive eigenvalues, $\Omega_0^{1/4}$ can be computed by simply taking the fourth root of its eigenvalues.) This yields symmetric $\{\delta A_{w0}\}$ that are approximately whitened.
4. Repeat step 2 but using $\delta A_{w0}$ on the right-hand side instead of $\delta A_0$ to obtain $\Omega_1 = \langle (\delta A_{w0}^T)(\delta A_{w0}) \rangle$. Then repeat step 3 to obtain $\delta A_{w1} = \Omega_1^{1/4}(\delta A_{w0})\Omega_1^{1/4}$.
5. Repeat step 4 for M iterations to finally obtain $\Omega_M = \langle (\delta A_{w(M-1)}^T)(\delta A_{w(M-1)}) \rangle$. The final whitening matrix is then $$W = \prod_{j=0}^{M} \Omega_j^{1/4},$$

such that $A_W = W^T A W$ is whitened and symmetric.

Perfect whitening as defined in Eq. (9) would require a large number of iterations. However, in an embodiment herein, perfect whitening is not necessary. It is provided that $N_{MC}=1000$ and $M=10$ yields good results and only requires a few seconds of computing time. Furthermore, as stated previously, this derivation of the whitening matrix W need only be performed once at the beginning of a measurement analysis.

If $\delta A_W$ is the difference between the whitened data A-matrix and some whitened physical A-matrix, then the $\chi_{mat}^2$ for the physical A-matrix is:

$$\chi_{mat}^2 = Tr[(\delta A_W^T)(\delta A_W)] \quad (11)$$

where Tr[M] is the trace of the matrix M. The "mat" subscript is used on $\chi_{mat}^2$ to differentiate this $\chi^2$ from the one defined in Eq. (5) from the covariance of the vector a since the two $\chi^2$ are not equivalent. Numerical experiments have shown that both Eq. (5) and Eq. (11) yield $\chi^2$ distributions when applied to Monte Carlo data sets. However, the $\chi^2$ from Eq. (5) has (2N−1) degrees of freedom while $\chi_{mat}^2$ has N degrees of freedom. Both are statistically meaningful descriptors, but $\chi_{mat}^2$ is the more appropriate measure for the whitened matrices used for MMSA.

In an embodiment herein, the closest physical $A_{pW}$ and/or the closest physical, rank-m, $A_{mW}$ are determined. The alternating projection technique is an established method to find the closest member of a set that simultaneously satisfies two convex constraints when it is known how to find the closest member that satisfies each constraint separately. In this case, the constraints on a physical $A_{pW}$ are that (1) it be a non-negative definite matrix (no negative eigenvalues) and (2) that its unwhitened version $A=W^{-1}A_{pW}W^{-T}$ be a Hankel matrix. It can be shown that the set of all non-negative matrices is convex as is the set of Hankel matrices, so alternating projection is guaranteed to find a unique, closest physical $A_{pW}$. On the other hand, the set of rank-m, non-negative definite matrices is not convex, so alternating projection is not guaranteed to find a unique, closest physical rank-m (m-carrier) $A_{mW}$. Nevertheless, alternating projection can find a closest physical rank-m (m-carrier) $A_{mW}$. The fact that the result is not necessarily a unique closest result must be remembered when looking at the specific carriers in the result, but is not so important when computing probabilities for the multicarrier mobility spectra since any other equally-close solutions have the same probability as the found solution.

In an embodiment herein, the alternating projection method proceeds by alternately finding the solution that meets the first constraint, and then the closest solution to that, which satisfies the second constraint, then the closest solution to that which meets the first constraint again, and so forth. Eventually, the method converges to a closest solution that satisfies both constraints. The following two sections describe the methods to find the closest non-negative definite matrix and then to find the closest whitened Hankel matrix.

An embodiment herein provides a method to find a closest non-negative definite matrix when the "closeness" is determined by the Frobenius norm of the difference between the matrices. In an embodiment herein, this is the situation that exists after the symmetric whitening as described above. In an embodiment herein, the method to find the closest non-negative definite matrix is to:
1. Perform an eigenvalue expansion $A_W = X^T\Gamma x$, where the columns of X are the eigenvectors of $A_W$ and $\Gamma$ is a diagonal matrix containing the eigenvalues of $A_W$.
2. Zero any negative eigenvalues in $\Gamma$ to produce $\Gamma_0$ and then compute the closest non-negative definite matrix as $A_{WO}=X^T\Gamma_O X$.

For the second constraint the closest whitened Hankel matrix $A_{WH}$ to some $A_W$ is found by minimizing $|A_W-A_{WH}|^2$, where $A_{WH}=W^THW$, and H is a Hankel matrix. From the Hankel symmetry, $$(A_{WH})_{ij} = (W^T H W)_{ij} = \sum_{r,s=1}^{N} W_{ir} H_{rs} W_{sj} = \sum_{r,s=1}^{N} W_{ir} h_{r+s-1} W_{sj} \quad (12)$$

where h is the vector form of H. Eq. (12) is a linear relationship between the (2N−1) elements of h and the $N^2$ elements of $A_{WH}$. If $A_{WH}$ is vectorized by defining $(\rho_{WH})_{(i-1)N+j}=(A_{WH})_{ij}$, Eq. (12) becomes:

$$\rho_{WH} = \Omega \cdot h \quad (13)$$

where $\Omega$ is an $N^2 \times (2N-1)$ matrix defined by:

$$\Omega_{ik} = \sum_{r=\max[1,k-N+1]}^{\min[k,N]} W_{\text{floor}[t-1/N],r} W_{\text{mod}[t-1,N],k-r+1} \quad (14)$$

and where min[x,y] is the minimum of x and y, max[x,y] is the maximum of x and y, floor[x] is the largest integer less than or equal to x, and mod[m,n] is the remainder on division of m by n. In this vectorized form of Eq. (13), one needs to minimize $|\rho_W-\rho_{WH}|^2=|\rho_W-\Omega \cdot h|^2$, where $\rho_W$ is the vectorized form of the original $A_W$. The solution for h that minimizes $|\rho_W-\Omega \cdot h|^2$ is:

$$h = \Omega^+ \cdot \rho_W \quad (15)$$

where $\Omega^+$ is the generalized matrix inverse (also called pseudoinverse) of $\Omega$, so the matrix $H_{ij}=h_{i+j-1}$ is the required closest whitened Hankel matrix to the original $A_W$.

With methods established to find the closest matrices that satisfy the constraints separately, the alternating projection method can be used to find the closest matrix that satisfies both constraints. In practice, the alternating projection is iterated until the $\chi_{mat}^2$ of the solution changes less than some fractional amount $\Delta\chi^2$ in the last iteration. A cutoff value of $\Delta\chi^2/\chi^2=0.001$ usually works well.

The MMSA results can be presented in a variety of ways. However, FIG. 3A provides several features.

A first feature of the presentation in FIG. 3A is that the logarithmic axes show a wide range of mobility and carrier density. Electrons are shown on the left and holes on the right, with the minimum-mobility holes and electrons meeting at the center. This reflects the fact that very low mobility holes are indistinguishable from very low mobility electrons in a Hall measurement. The probability peak for such very low mobility carriers typically straddles the center line and extends into both the electron and hole regions. A suitable value for the minimum mobility that avoids a significant discontinuity between the electron and hole sides of any low-mobility peak can be selected based on the maximum magnetic field used for the Hall measurement. For maximum field B in Tesla, a suitable minimum mobility is typically $(0.1 \text{ m}^2/\text{V-s})/\text{B}$.

A second feature of the presentation in FIG. 3A is that although carrier probability peaks generally fit better on plots of probability versus mobility and conductivity, users are more interested in the density of the carriers than their conductivity. Since the density n and conductivity $\sigma$ are related by $n=\sigma/(e\mu)$, where e is the electronic charge and $\mu$ is the mobility, the lines of constant carrier density are simply diagonal straight lines on a logarithmic plot versus μ and σ. By labeling the ends of the diagonal lines with carrier density as shown in FIG. 3A, the user can easily read the value and uncertainty for the density of any peak while maintaining the benefit of the plot using conductivity for the vertical coordinate.

When the uncertainty (error) statistics for the measurement (or simulation) are well known, it is useful to plot probability versus μ and σ. However, in many cases the magnitude of the errors is not well known. In those cases, it is preferable to plot $1/\chi^2$ which peaks in the same places as probability, but which more easily autoscales as the magnitude of the errors changes. For example, if the actual measurement errors are a factor of 10 higher than expected, the autoscaled plot $1/\chi^2$ will not change at all, but the plot of probability may change dramatically, perhaps missing some peaks entirely. In other words, the plot of $1/\chi^2$ works well even when the measurement errors are only approximately known or estimated.

The procedures above find the A-matrix and its probability (or $1/\chi^2$) for the closest physical solution, or finds the closest reduced A-matrix and its probability (or $1/\chi^2$) for the points in the MMSA spectrum. However, it is also useful to know the actual carriers that are associated with the closest A-matrix.

An embodiment herein provides a method for the determination of closest carriers. To do so, first the mobilities of the carriers are determined. As noted above, the closest physical A-matrix to an unphysical A is always singular with one or more zero eigenvalues. In an embodiment herein, the steps to find the mobilities are:

1. Perform the eigenvalue expansion $A=X^T\Gamma X$, where the columns of X are the eigenvectors of A, and Γ is a diagonal matrix containing the eigenvalues of A. The eigenvectors associated with non-zero eigenvalues span the range of A while the eigenvectors associated with zero eigenvalues span the null space of A. Let $n_0$ be the number of such null-space eigenvectors $\{u_{ni}\}$.
2. Any vector within the range of A will be orthogonal to all of the $\{u_{ni}\}$. Since the A-matrix for a single carrier with mobility μ is the dyadic matrix μμ, where $\mu=\{1, -\mu, \mu^2, \ldots, \mu^{N-1}\}$, all single carriers in the range of A will have $\mu \cdot u_{ni}=0$ for all of the null-space eigenvectors. This constitutes $n_0$ polynomial equations, each of degree N−1, for μ. It can be shown that this yields N−$n_{null}$ real solutions for μ, which are the mobilities of the carriers associated with A.

Next, the conductivities associated with those mobilities are determined. Here it is convenient to work with the (2N−1)-long a-vector associated with A. The full a can be written as a sum of the a-vectors for each of the (N−$n_0$) discrete carriers. The basis vector for the $i^{th}$ carrier is $\mu_i=\{1, -\mu, \mu_i^2, \ldots, \mu_i^{2N-1}\}$. If one lets Φ be the N×(N−$n_0$) matrix of basis vectors, then a=Φ·a, where a is a vector of (N−$n_0$) amplitudes. The amplitudes can then be calculated from a=Φ⁺·a, where Φ⁺ is the generalized inverse of Φ. The required carrier conductivities are finally obtained from the amplitudes by: $\sigma_i=\alpha_i\Pi_{p=1}^{N}(1+H^2_p\mu^2)$.

According to an exemplary embodiment herein, Table I shows all of the closest m-carrier solutions for the same Hall data used in FIG. 3A. The final entry in Table I shows the closest physical solution, which has seven carriers. Adding carriers beyond these seven carriers yields no further improvement in $1/\chi^2$. As shown in Table I, the embodiments herein make it possible to use a large number of carriers.

TABLE I

Closest $1/\chi^2$ and carrier properties for the same Hall data used in FIG.

| Carriers | $1/\chi^2$ | Mobility | Conductivity |
|---|---|---|---|
| 1 | 0.000182614 | −0.872612 | 0.00823385 |
| 2 | 0.00109965 | 0.222696 | 0.00159913 |
|   |   | −1.02043 | 0.00921506 |
| 3 | 0.0289013 | 0.843092 | 0.00266547 |
|   |   | 0.0541244 | 0.000633956 |
|   |   | −1.09059 | 0.00933323 |
| 4 | 0.315628 | 0.975815 | 0.00260269 |
|   |   | 0.105966 | 0.000690448 |
|   |   | −0.116788 | 0.000247927 |
|   |   | −1.13904 | 0.00929391 |
| 5 | 9.49559 | 1.02882 | 0.00253295 |
|   |   | 0.160784 | 0.000616882 |
|   |   | −0.00745622 | 0.000305548 |
|   |   | −0.644536 | 0.00121523 |
|   |   | −1.23212 | 0.0082486 |
| 6 | 36.8448 | 1.1745 | 0.00172592 |
|   |   | 0.754265 | 0.000883052 |
|   |   | 0.136081 | 0.00060845 |
|   |   | −0.0237165 | 0.000259772 |
|   |   | −0.697392 | 0.00150255 |
|   |   | −1.24618 | 0.00795376 |
| 7 | 82.4336 | 1.20237 | 0.0015231 |
|   |   | 0.799561 | 0.00107666 |
|   |   | 0.140642 | 0.00060421 |
|   |   | −0.0183508 | 0.000268736 |
|   |   | −0.618984 | 0.000973947 |
|   |   | −1.20756 | 0.00841005 |
|   |   | −3.47329 | 0.0000855753 |

In Table I, carrier mobility is in m²/V-s, and conductivity is in Siemens. The closest physical solution has seven carriers.

It may be useful to display specific carrier properties with the MMSA spectrum. FIG. 3B, with reference to FIGS. 1 through 3A, is a graph illustrating the same 4-carrier MMSA as in FIG. 3A, but with the mobility and density of the carriers for a particular solution as shown in Table II. The second carrier shown in Table II corresponds to the crosshair on the graph. The solid white dots on the graph illustrate the other three carriers, whose properties are also presented in Table II. The circles on FIG. 3B illustrate the location of the most probable four carriers.

The user specified that the solution include the carrier indicated by the white cross-hair (by clicking on that location in the plot), and the program plotted the solid white dots showing the other three carriers in the closest solution and also listed the properties of all four carriers along with $1/\chi^2$ as shown in Table II.

TABLE II

Properties of all 4 carriers along with $1/\chi^2$ values

| Mobility | Conductivity | Density |
|---|---|---|
| −1.12301 | 0.00931133 | 5.17507 × 10¹⁶ |
| −0.0812831 | 0.000213796 | 1.64168 × 10¹⁶ |
| 0.108377 | 0.000670231 | 3.85989 × 10¹⁶ |
| 0.970885 | 0.00260133 | 1.67231 × 10¹⁶ |

| | $1/\chi^2$ |
|---|---|
| Norm | 0.704294 |
| Raw | 0.224024 |

The embodiments herein provide for deducing the multiple carrier densities and mobilities within the material of an electronic device by applying the specified procedure to data from a Hall measurement taken at multiple magnetic fields.

This understanding of the densities and mobilities, provided by embodiments herein, is very useful for deducing the quality of the material of an electronic device and for understanding the type of conducting paths that exist within the sample. Therefore, the embodiments herein can be used for developing new electronic material structures, assessing the quality of electronic materials in a production environment, and similar functions. The embodiments herein may be implemented as an integral part of a Hall measurement station, such that the measurement station provides the user with the carrier properties immediately after the measurement, or as a separate post-measurement analysis package.

Figure 4:
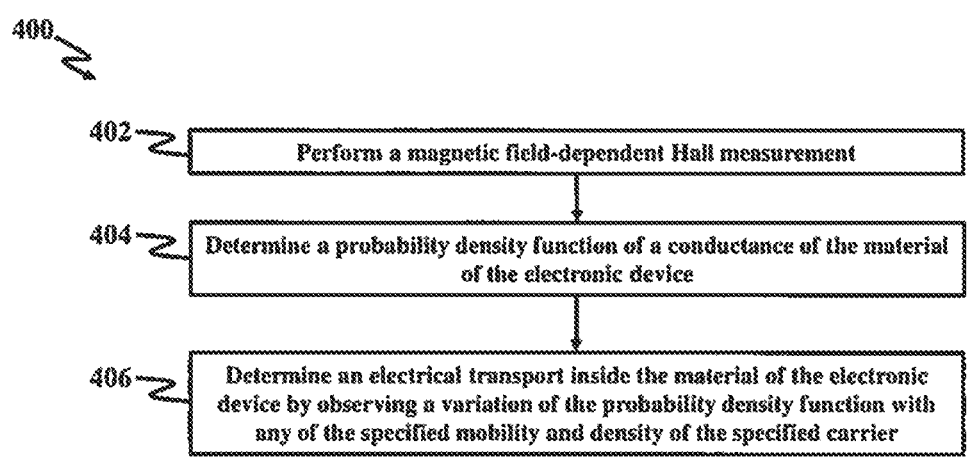
FIG. 4 is a flowchart illustrating a method according to an embodiment herein.

FIG. 4, with reference to FIGS. 1 through 3B, is a flowchart illustrating a method 400 according to the embodiments herein. The method 400 may include performing (402) a magnetic field-dependent Hall measurement; determining (404) a probability density function of a conductance of the material of the electronic device; and determining (406) an electrical transport of electrons and holes inside the material of the electronic device by observing a variation of the probability density function with any of the specified mobility and density of the specified carrier.

The embodiments herein may be embodied as a computer program product configured to include a pre-configured set of instructions, which when performed, can result in actions as stated in conjunction with the methods described above. In an example, the pre-configured set of instructions can be stored on a tangible non-transitory computer readable medium or a program storage device. In an example, the tangible non-transitory computer readable medium can be configured to include the set of instructions, which when performed by a device, can cause the device to perform acts similar to the ones described here. Embodiments herein may also include tangible and/or non-transitory computer-readable storage media for carrying or having computer executable instructions or data structures stored thereon. Such non-transitory computer readable storage media can be any available media that can be accessed by a special purpose device, including the functional design of any special purpose processor as discussed above.

By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a special purpose device to perform a certain function or group of functions. Computer-executable instructions also include program modules that are executed by computers in stand-alone or network environments. Generally, program modules include routines, programs, components, data structures, objects, and the functions inherent in the design of special-purpose devices, etc. that perform particular tasks or implement particular abstract data types. Computer executable instructions, associated data structures, and program modules represent examples of the program code means for executing steps of the methods disclosed herein. The particular sequence of such executable instructions or associated data structures represents examples of corresponding acts for implementing the functions described in such steps.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor, and may be configured, for example, as a kiosk.

The embodiments herein can include both hardware and software elements. The embodiments that are implemented in software include but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments herein is depicted in FIG. 5, with reference to FIGS. 1 through 4. This schematic drawing illustrates a hardware configuration of an information handling/computer system 500 in accordance with the embodiments herein. The system 500 comprises at least one processing device 10. The special-purpose CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system 500 can read the inventive instructions on the program storage devices and follow these instructions to execute the methodology of the embodiments herein. The system 500 further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example. Further, a transceiver 26, a signal comparator 27, and a signal converter 28 may be connected with the bus 12 for processing, transmission, receipt, comparison, and conversion of electric or electronic signals.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for determining a two-dimensional spectrum of a specified carrier having both a specified mobility and density in a material of an electronic device, said method comprising:

performing or acquiring a magnetic field-dependent Hall measurement on said material of said electronic device, said magnetic field-dependent Hall measurement comprising an electrical signal generated in response to a magnetic field being applied perpendicular to a current through the material; and processing said magnetic field-dependent Hall measurement, using a computer, to determine the two-dimensional spectrum of a specified carrier by:

determining, using said magnetic field-dependent Hall measurement, a probability of the specified carrier existing as a function of both a mobility and a density, wherein said probability function describes the spectrum for a plurality of m-carriers, where m is an integer, and provides an estimate of uncertainty in density and mobility; and determining an electrical transport of a plurality of electrons and holes inside said material of said electronic device by observing a variation of said probability function with said specified mobility and density of said specified carrier.

2. The method of claim 1, wherein determining said probability comprises:

determining a first a-vector, wherein said first a-vector is a representation of said magnetic field-dependent Hall measurement;

determining a covariance matrix of said first a-vector using any of known and assumed measurement uncertainties in said magnetic field-dependent Hall measurement;

determining, using said covariance matrix, a statistical chi-squared measure and a probability of a difference between said first a-vector and a second a-vector being equivalent to any of said known and said assumed measurement uncertainties; and determining, using any of said statistical chi-squared measure and said probability of said difference between said first and second a-vectors, a closeness of said first and second a-vectors corresponding to any of a smallness of an amount of said statistical chi-squared measure and largeness of an amount of said probability of said difference between said first and second a-vectors.

3. The method of claim 2, wherein determining said probability further comprises:

calculating a first a-matrix using said first a-vector, said first a-matrix having a Hankel symmetry;

calculating a plurality of eigenvalues of said first a-matrix and classify said first a-matrix, corresponding to said magnetic field-dependent Hall measurement physical or unphysical, wherein said first a-matrix is classified as physical when all of said plurality of eigenvalues are non-negative, and is described by at least one spectrum of said plurality of m-carriers with a plurality of all non-negative conductivities, and wherein said first a-matrix is classified as unphysical when any of said plurality of eigenvalues is negative; and determining, using said first a-matrix, an envelope of a plurality of all possible spectra that yield said magnetic field-dependent Hall measurement, wherein said envelope further describes a maximum conductivity of said plurality of m-carriers as a function of said mobility.

4. The method of claim 3, wherein determining said probability further comprises:

determining a closest physical a-matrix to said unphysical a-matrix, by iteratively determining a new closest a-matrix with non-negative eigenvalues, and determining a closest Hankel matrix to said a-matrix with non-negative eigenvalues, until said new closest a-matrix converges to said closest physical Hankel matrix;

terminating the iteration upon a chi-squared difference between said closest a-matrix and said new closest a-matrix changes by less than approximately 0.001; and determining a set of m-physical carriers corresponding to said closest Hankel matrix.

5. The method of claim 4, wherein determining said probability further comprises:
 determining a reduced a-matrix using said magnetic field-dependent Hall measurement, minus a specified a-matrix corresponding to said specified carrier having said specified mobility and density; and
 determining a closest physical a-matrix to said reduced a-matrix.

6. The method of claim 5, wherein determining said closest physical a-matrix uses a symmetric whitening matrix that depends on noise in said magnetic field-dependent Hall measurement.

7. The method of claim 6, further comprising multiplying said first a-matrix by said symmetric whitening matrix to determine a whitened a-matrix.

8. The method of claim 7, wherein said closest Hankel matrix is determined by:
 calculating a special rectangular-matrix form of said symmetric whitening matrix;
 computing a generalized inverse matrix of said rectangular-matrix form of said symmetric whitening matrix; and
 multiplying said generalized inverse matrix with a rectangular-matrix form of a whitened version of said first a-matrix.

9. The method of claim 8, wherein said symmetric whitening matrix is determined by:
 (a) computing a set of Monte Carlo noise matrices for said magnetic field-dependent Hall measurement;
 (b) computing a plurality of noise-squared matrices corresponding to each of said Monte Carlo variations;
 (c) computing an average of said noise-squared matrices;
 (d) computing a fourth root matrix of said average of said noise-squared matrices, and multiplying each of said Monte Carlo noise matrices both on a left and a right side with said fourth root matrix to obtain a set of approximately whitened symmetric matrices;
 (e) repeating the steps (b) through (d), using said approximately whitened noise matrices from the step (d) instead of said Monte Carlo noise matrices;
 (f) repeating the steps (b)-(d) for a pre-determined number of times, saving a plurality of unique versions of said fourth root matrix computed in each pass through the step (d); and
 (g) determining said symmetric whitening matrix by multiplying said plurality of unique versions of said fourth root matrix saved in step (f).

10. The method of claim 9 further comprises plotting a probability associated with said closest physical a-matrix versus said specified carrier having said specified mobility and density, wherein a maxima in the plot indicates said specified carrier densities and mobility, and a width of said maxima indicate uncertainties in said specified density and mobility.

11. A non-transitory program storage device readable by computer, and comprising a program of instructions executable by said computer to perform a method for determining a two-dimensional spectrum of a specified carrier having a specified mobility and density in the material of an electronic device, said method comprising:
 performing or acquiring a magnetic field-dependent Hall measurement on said material of said electronic device, said magnetic field-dependent Hall measurement comprising an electrical signal generated in response to a magnetic field being applied perpendicular to a current through the material; and
 processing said magnetic field-dependent Hall measurement, using a computer, to determine the two-dimensional spectrum of a specified carrier by:
  determining, using said magnetic field-dependent Hall measurement, a probability of the specified carrier existing as a function of both a mobility and a density, wherein said probability function describes the spectrum for a plurality of m-carriers, where m is an integer, and provides an estimate of uncertainty in density and mobility; and
  determining an electrical transport of a plurality of electrons and holes inside said material of said electronic device by observing a variation of said probability with said specified mobility and density of said specified carrier.

12. The program storage device of claim 11, wherein determining said probability comprises:
 determining a first a-vector, wherein said first a-vector is a representation of said magnetic field-dependent Hall measurement;
 determining a covariance matrix of said first a-vector using any of known and assumed measurement uncertainties in said magnetic field-dependent Hall measurement;
 determining, using said covariance matrix, a statistical chi-squared measure and a probability of a difference between said first a-vector and a second a-vector being equivalent to any of said known and said assumed measurement uncertainties; and
 determining, using any of said statistical chi-squared measure and said probability of said difference between said first and second a-vectors, a closeness of said first and second a-vectors corresponding to any of a smallness of an amount of said statistical chi-squared measure and largeness of an amount of said probability of said difference between said first and second a-vectors.

13. The program storage device of claim 12, wherein determining said probability further comprises:
 calculating a first a-matrix using said first a-vector, said first a-matrix having a Hankel symmetry;
 calculating a plurality of eigenvalues of said first a-matrix and classify said first a-matrix, corresponding to said magnetic field-dependent Hall measurement physical or unphysical, wherein said first a-matrix is classified as physical when all of said plurality of eigenvalues are non-negative, and is described by at least one spectrum of said plurality of m-carriers with a plurality of all non-negative conductivities, and wherein said first a-matrix is classified as unphysical when any of said plurality of eigenvalues is negative; and
 determining, using said first a-matrix, an envelope of a plurality of all possible spectra that yield said magnetic field-dependent Hall measurement, wherein said envelope further describes a maximum conductivity of said plurality of m-carriers as a function of said mobility.

14. The program storage device of claim 13, wherein determining said probability further comprises:
 determining a closest physical a-matrix to said unphysical a-matrix, by iteratively determining a new closest a-matrix with non-negative eigenvalues, and determining a closest Hankel matrix to said a-matrix with non-negative eigenvalues, until said new closest a-matrix converges to said closest physical Hankel matrix;

terminating the iteration upon a chi-squared difference between said closest a-matrix and said new closest a-matrix changes by less than approximately 0.001; and determining a set of m-physical carriers corresponding to said closest Hankel matrix.

15. The program storage device of claim 14, wherein determining said probability further comprises:

determining a reduced a-matrix using said magnetic field-dependent Hall measurement, minus a specified a-matrix corresponding to said specified carrier having said specified mobility and density; and determining a closest physical a-matrix to said reduced a-matrix.

16. The program storage device of claim 15, wherein determining said closest physical a-matrix uses a symmetric whitening matrix that depends on noise in said magnetic field-dependent Hall measurement.

17. The program storage device of claim 16, wherein said method further comprises multiplying said first a-matrix by said symmetric whitening matrix to determine a whitened a-matrix.

18. The program storage device of claim 17, wherein said closest Hankel matrix is determined by:

calculating a special rectangular-matrix form of said symmetric whitening matrix;

computing a generalized inverse matrix of said rectangular-matrix form of said symmetric whitening matrix; and multiplying said generalized inverse matrix with a vectorized form of a whitened version of said first a-matrix.

19. The program storage device of claim 18, wherein said symmetric whitening matrix is determined by:

(a) computing a set of Monte Carlo noise matrices for said magnetic field-dependent Hall measurement;

(b) computing a plurality of noise-squared matrices corresponding to each of said Monte Carlo variations;

(c) computing an average of said noise-squared matrices;

(d) computing a fourth root matrix of said average of said noise-squared matrices, and multiplying each of said Monte Carlo noise matrices both on a left and a right side with said fourth root matrix to obtain a set of approximately whitened symmetric matrices;

(e) repeating the steps (b) through (d), using said approximately whitened noise matrices from the step (d) instead of said Monte Carlo noise matrices;

(f) repeating the steps (b)-(d) for a pre-determined number of times, saving a plurality of unique versions of said fourth root matrix computed in each pass through the step (d); and (g) determining said symmetric whitening matrix by multiplying said plurality of unique versions of said fourth root matrix saved in step (f).

20. The program storage device of claim 19, wherein said method further comprises plotting a probability associated with said closest physical a-matrix versus said specified carrier having said specified mobility and density, wherein a maxima in the plot indicates said specified carrier densities and mobility, and a width of said maxima indicate uncertainties in said specified density and mobility.

* * * * *